(12) United States Patent
Hu et al.

(10) Patent No.: US 8,312,404 B2
(45) Date of Patent: Nov. 13, 2012

(54) MULTI-SEGMENTS MODELING BOND WIRE INTERCONNECTS WITH 2D SIMULATIONS IN HIGH SPEED, HIGH DENSITY WIRE BOND PACKAGES

(75) Inventors: Haitian Hu, Hopewell Jct., NY (US); Timothy W. Budell, Essex Jct., VT (US); Charles S. Chiu, Essex Jct., VT (US); Eric Tremble, Essex Jct., VT (US)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 12/492,198

(22) Filed: Jun. 26, 2009

(65) Prior Publication Data
US 2010/0332193 A1    Dec. 30, 2010

(51) Int. Cl.
  *G06F 17/50* (2006.01)
(52) U.S. Cl. .................. 716/115; 716/111; 716/112
(58) Field of Classification Search ............... 716/115, 716/111, 112, 136
See application file for complete search history.

(56) References Cited

U.S. PATENT DOCUMENTS

| | | | |
|---|---|---|---|
| 6,510,539 B1 * | 1/2003 | Deemie et al. ............... | 716/111 |
| 2004/0163058 A1 * | 8/2004 | Frank et al. .................. | 716/5 |
| 2005/0114807 A1 * | 5/2005 | Gasparik ...................... | 716/5 |
| 2006/0245308 A1 * | 11/2006 | Macropoulos et al. ....... | 369/1 |
| 2009/0193370 A1 * | 7/2009 | Bantas et al. ................ | 716/4 |

OTHER PUBLICATIONS

D. Zwitter, et al, "Competitiveness and Technical Challenges of Low Cost Wirebond Packaging for High Speed SerDes Applications in ASICS", IEEE 2007 Electronic Components and Technology Conference, pp. 777-784, 2007.

S.B. Bulumulla, et al., "A Comparison of Large I/O Flip Chip and Wire Bonded Packages", IEEE 51st Electronic Components and Technology Conference, pp. 1122-1126, May 29-Jun. 1, 2001.

D. Draper, et al., High-Performance, Four-Layer, Wire-Bonded, Plastic Ball Grid Array Package for a 10 Gbps per Lane Backplane SerDes Transceiver, IEEE 54th Electronic Components and Technology Conference, pp. 1200-1208, Jun. 1-4, 2004.

K. Goto, et al., "IC Package and Bonding Wire Modeling Software and Its Application to RFIC Design", IEEE MTT-S Digest, pp. 2109-2112, 2002.

(Continued)

*Primary Examiner* — Vuthe Siek
*Assistant Examiner* — Mohammed Alam
(74) *Attorney, Agent, or Firm* — H. Daniel Schnurmann

(57) ABSTRACT

A method for modeling bond wires in an IC package for predicting noise effects generated by electromagnetic coupling in complex bond wire configurations. A look-up table of equivalent LC circuit models for the bond wires is generated that accurately predicts the effects of the bond wire circuitry of a signal transmission system. Switch and mirror techniques are applied to reduce the bond wire configurations necessary to simulate. The method includes: setting parameters related to the IC package layout of groups of bond wires; sub-dividing each group of bond wires into regions, each including a portion of the bond wire or its corresponding pad, and generating dissection planes for the regions consisting of the bond wires; performing a 3D simulation on the regions consisting of the corresponding pads, and a 2D simulation for each dissection plane; constructing equivalent circuit models for groups of bond wires and corresponding pads based on the 3D and 2D simulations results; inputting the equivalent circuit models into a circuit simulator to measure the noise effects; and modifying the layout geometry to meet noise targets.

22 Claims, 8 Drawing Sheets

OTHER PUBLICATIONS

F. Alimenti, et al., "Quasi Static Analysis of Microstrip Bondwire Interconnects", Microwave Symposium Digest, 1995, IEEE MTT-S International May 16-20, 1995, pp. 679-682, vol. 2.

F. Alimenti, et al., "Modeling and Characterization of the Bonding-Wire Interconnection", Microwave Theory and Techniques, IEEE Transactions, vol. 49, No. 1, Jan. 2001, pp. 142-150.

\* cited by examiner

DIAGRAM OF THE CONNECTION OF DIE MODEL, BOND MODEL AND PACKAGE MODEL

EQUIVALENT CIRCUIT FOR DIE PAD SECTION

EQUIVALENT CIRCUIT FOR VERTICAL SECTION

MULTI-SEGMENTS MODELING BOND WIRE INTERCONNECTS WITH 2D SIMULATIONS IN HIGH SPEED, HIGH DENSITY WIRE BOND PACKAGES

FIELD OF THE INVENTION

The present invention relates to the Design Automation of Integrated Circuit packages, and more particularly, to electromagnetic modeling and extracting electrical parasitics of bond wire interconnects in advanced wire bond packages of semiconductor chips.

BACKGROUND OF THE INVENTION

It is known in the art that chips are typically mounted in or on wire bond packages. Electrical signal propagation and power transportation between chips and packages are through bond wires which connect the wires on the chips to the wires in the packages. Compared with its traditional counterpart, advanced wire bond package technology has a denser bond wire layout and higher speed. It pushes the application space into Gbps, which is comparable to but less expensive than other package technologies, such as High Performance Glass ceramic (HPGC) package technology, alumina ceramic package technology and organic flip-chip Plastic Ball Grid Array (FCPBGA) package technology.

With the ever-increasing speed and integration level in wire bond packages, the problem of electrical noise on signal propagation is becoming increasingly pronounced. A major noise source in advanced wire bond designs with high density I/Os is electromagnetic (EM) coupling among numerous long and closely laid-out bond wires. The parasitic inductance (L) and capacitance (C) between bond wires are dominant electrical parameters in determining the coupling and the quality of signal transmission in this package technology. Bond wire structures usually are rather complicated. The traditional methods to extract these geometry-based parasitics are either very time-consuming or inaccurate for realistic, large-scale wire bond applications. Therefore, prompt and accurate EM modeling and extraction of high frequency parasitic inductance and capacitance at coupled signal bond wires is critical to noise prediction and electrical signal integrity in high speed high density wire bond packages.

Inductance and capacitance elements are generally included in equivalent circuit models which are fed into circuit simulator such as SPICE to calculate the noise level caused by these Ls and Cs. In the circuit analysis of chip-package-board system, each chip, package and board has its corresponding equivalent circuit model. An equivalent circuit models is more like a black box which incorporates the signal transmission properties of the circuit. By simulating the cascaded equivalent circuit models from the chip, package and board, the electrical noise and signal integrity of the entire chip-package-board system can be determined. Each equivalent circuit model typically consists of multiple 'sub-models' representing portions of the circuit. The intent of electromagnetic (EM) modeling of the bond wires in advanced wire bond packages is to create an equivalent circuit model of the bond wires which can then be sequentially connected to the equivalent circuit models of the rest portion of the package, the chip and the board for the circuit analysis of the whole system.

With the ever-increasing speed and integration level in wire bond packages, the problem of electrical noise is becoming increasingly pronounced. A major noise source in advanced wire bond designs with high density I/Os is electrical coupling among numerous long and closely laid-out bond wires. The parasitic inductance and capacitance between bond wires are dominant electrical parameters in determining the coupling and the quality of signal transmission. Prompt and accurate modeling and extraction of high frequency parasitic inductance and capacitance at coupled signal bond wires is critical to noise prediction and electrical signal integrity in high speed high density wire bond packages.

Equivalent circuit models of the bond wires can be described by S parameters or SPICE like circuits extracted from full wave three dimensional (3D) EM simulation tool like HFSS for the best accuracy. This type of tools requires the definition of EM ports to introduce EM waves as sources and then solve Maxwell electromagnetic equations through numerical computation in user-specified space with the considerations of 3D propagation of electromagnetic waves and the full range of frequency points from DC to as high as user specified maximum frequency. The results from these tools are equivalent circuit models which describe the EM wave propagation among ports, typically in the form of S parameters (scattering parameters) or SPICE like circuits consisting of a plurality of resistance (R), inductance (L) and capacitance (C) elements. R, L, C elements are obtained by matching S parameters at the ports. Full wave 3D EM simulation is the most accurate EM analysis tool in bond wire modeling. However, some well known disadvantages of the above numerical computation method include long runtime, typically in the order of 3 to 4 hrs for a group of several bond wires. Considering the number of possible bond wire structures to model in a wire bond package, it is impractical to adopt full wave 3D simulation tool for the analysis of the bond wires for the entire package. Another disadvantage is that it requires high level of EM knowledge and simulation experience for each analysis, which package designers are usually not equipped with. The third disadvantage is the convergence problem inheriting in numerical computation which leads to a longer time for a successful run.

Another widely used method to model bond wires is to extract lumped inductance L and capacitance C by simple empirical formulae. The empirical formulae provide lumped self inductance and capacitance as well as mutual inductance and capacitance between two bond wires, based on the most basic geometric parameters such as diameter of cross-section of wires, length, and spacing between two wires. Each bond wire is represented as one lumped LC segment which can be connected with circuitry from the rest of the package. Opposite to the EM simulation method, empirical formulae are calculated very fast. However, these formulae can only be developed over relatively simple geometries of the bond wires. With the inherent complexity in bond wire structures, for example, the existence of multiple signal and ground wires in calculation, wires with different length and curvature etc., the models obtained by applying these formulae on realistic wire bonding designs are usually not accurate.

Quasi-static 3D modeling is a third methodology for modeling bond wires. It differs from full wave 3D EM simulation in that it only simulates at one frequency point. It may require complicated mesh generation procedure like full wave 3D EM simulation or compute LC by simple formula. Therefore, the method could have runtime problem as in a full wave 3D EM simulation or may be too simplistic to handle realistic high speed signal transition on bond wires. Therefore a methodology is needed to fast and accurately model bond wires for the analysis of realistic high speed and high density wire bond designs.

Referring to FIG. 1, a top view of a prior art wire bond package is shown in which the die (chip) is on top of the package (11). FIG. 2(a) is a top-down view illustrating a portion of the prior art wire bond design shown in FIG. 1.

Chip (13) is preferably mounted at the center of the package and connected to the package through bond wires (12) from the die pads (21 and 22) at the edge of the chip to the bond finger pads (26 and 27) on the top metal layer of the package. Signals and power systems for a wire bond integrated circuit package are all delivered along the bond wires. Shown in FIG. 2(a) are inner die pad row (21) and outer die pad row (22) staggered by about half-pad pitch. Likewise, bond finger pads on the package are also distributed in an inner bond finger row (26) and an outer bond finger row (27) with much larger spacing between rows and larger pad pitch than those of the die pads. It is noted that some designs have only one die pad row, and others may have only one bond finger pad row. Between chip edge and inner bond finger pads, there are three rings of metal planes on package, designated by the landing of GND (23), VDD (24) and VDD (25) power systems from chip in a typical wire bond package design. Some designs may only have one or two rings.

FIG. 2(b) shows a schematic side view of the structure shown in FIG. 2(a). Die pads (21, 22) are higher than bond finger pads by the height of the die (28). In order to avoid electrical shorts, bond wires, referenced as loop 2, are connected to inner die pads and are higher than those linked to the outer die pads, referenced as loop 1. In addition, the large spacing among power/ground rings (23, 24, 25) and bond finger pad rows (26, 27), as well as the large pitch between the bond finger pads, contribute to avoid electrical shorts. In some design rules, it is permitted that bond wires starting from any die pad row can be connected to any bond finger pad row. Signal wires are usually laid out in an inner die pad row. Power/ground bond wires are much shorter, starting from outer die pads (22) and ending at power/ground rings (23, 24, 25). For high speed differential signal pairs, there are power/ground wires referred to as dedicated shields, on each side of the pair. Shields extend all the way to the bond finger pad rows where the pair ends.

According to the design rules, referring to the loop shown in FIG. 2(b), each bond wire depends on the die pad row and bond finger pad row corresponding to the respective ends of the wires. Once the loop type is found for a bond wire, the height of the wire is defined.

The bond wire structures discussed above meet JEDEC standard specifications. As shown in FIG. 3, each bond wire includes vertical ($h_2$), horizontal (d/8) and diagonal sections (d-d/8), wherein the length of horizontal section is ⅛ of a parameter d measured from the locations of the bond wire end points. Z=0 refers to the bottom plane of the package; $h_3$ is the thickness of the package; $h_1$ is the height of the die and the package; and $h_2$ is the height of bond wire measured from the die pad. Usually, bond wires originating from inner die pads (21) to any row of the bond finger pads (26, 27) have different height from those originating from outer die pads (22). Each bond wire in this modeling is described by the JEDEC standard geometry parameters.

The bond wire arrangements and structures are highly complex. Each signal bond wire can be a neighbor of another signal bond wire or power/ground wire. A signal bond wire can start from an inner die pad or an outer die pad, ending at the inner bond finger pad or outer bond finger pad. Although rules exist in removing some physically unrealistic geometry, the number of possible structures in real wire bond packages is exceedingly large. Therefore, modeling and simulating structures in high speed wire bond designs are essential for a fast and accurate estimate of the signal quality.

In high speed wire bond packages, electrical noise exists between any two bond wires, an undesired signal transition on one bond wire, referenced to as 'victim', may be induced by the signal transition on another bond wire, referenced to as 'aggressor'. The existence of other bond wires affects the noise level. Parasitic L and C couplings between a victim bond wire and its aggressor are dominant in determining the noise on the victim wire. The inductance and capacitance couplings are basically electromagnetic (EM) effects existing among wires when currents and voltages add on wires. The EM field around the victim wire is greatly influenced by the distance between the victim-aggressor pair, the type of aggressor, and the existence of neighboring power/ground shields, and the like.

Therefore, there is a need to tackle EM coupling problems in an industrially realistic bond wire configuration for high speed high density bond wire packages that is adaptable for any generic noise analysis tool to promptly compute the noise level in a wire bond design.

SUMMARY OF THE INVENTION

In one aspect of the invention, a method is provided for developing a fast and accurate bond wire parasitic inductance and capacitance extraction that builds an equivalent circuit model of the bond wires and delivers a signal noise analysis of an entire package in seconds. The method is advantageously used from early the final stages of the design and serves as a guide to meet design targets and verification. In this way, the cost and turn-around time of design are greatly reduced.

In another aspect, the invention incorporates the speed of a two dimensional (2D) EM simulation tool and the accuracy of a 3D EM simulation in accordance to the nature of the bond wires, starting with 2D models by breaking bond wires preferably into three regions, each dissected into small segments, and generates LC values for each individual segment with 2D EM tool. Current return paths are considered in each 2D simulation. The modeling method produces multi-segment equivalent circuit models consisting of LC values of each segment for a pair of victim and aggressor bond wires.

The present modeling method is significantly more accurate than the empirical formulae because all the important bond wires affecting the EM field between the victim and the aggressor wires are considered, including signal wires, ground shields, power/ground wires, ground planes, die pads. The inventive method allows manifold geometries of the bond wires, which are much more complex than the geometries empirical formulae they were developed from. The modeling method also handles the detailed curvature of the bond wires by inserting denser cut planes at certain portion of the bond wires leaving coarser cut planes for the remaining bond wires. However, curvature is not a parameter in empirical formulae. In some existing wire bond modeling methods, curvatures are coarsely considered by partitioning the wire into several big portions, each modeled by an empirical formula. This method cannot avoid the disadvantage of empirical formulae. In addition, the consideration of curvature is much less accurate than the present invention modeling methodology.

The modeling method is considerably faster than full wave 3D EM simulation tools. It is an engineering approximation and simplification of full wave 3D EM simulation by avoiding complicated mesh generation and high demand of computer resources. The accuracy of this simplified method is acceptable compared against full wave 3D EM simulation tools.

In still another aspect, the present invention overcomes disadvantages and limitations of the prior art by providing a multi-segment modeling and extraction methodology with 2D simulations. It considers the most relevant factors in EM coupling of realistic complicated bond wire configuration.

Therefore, it is substantially faster and accurate compared with conventional methods. Computer code is implemented to generate the look-up table of equivalent LC circuit models for bond wires that quickly and accurately predict the effects of bond wire circuitry in an integrated circuit signal transmission system. Switch and mirror techniques are applied to greatly reduce the number of bond wire configurations necessary for simulation. The software can be used together with package and chip models to predict noise problems during the design phase, which are highly beneficial to circuit designers who can predict, enabling resolving problems at an earlier stage of the design. This greatly reduces the turnaround time for circuits and prevents costly redesigns. Furthermore, the die size and die position often change during a high frequency design procedure, which in turn requires frequent changes in bond wire models. One of the advantages of the present invention is that table look-up equivalent circuit models for bond wires allows the user to repeatedly reuse the table and retest the design without a need to regenerate models.

In still another aspect, there is provided a method of modeling bond wires and their corresponding pads of an integrated circuit (IC) package design for predicting noise effects of the bond wires and the corresponding pads in an IC signal transmission path, the method including: a) setting parameters related to the IC package 3D layout geometry of a group of bond wires and their corresponding die pads; b) sub-dividing the group of bond wires and their corresponding die pads into regions, each region including a portion of each bond wire or its die pad, and generating dissection planes for the regions including only the bond wires; c) performing 3D simulations with a computer on the regions comprising the corresponding die pads and collecting inductive and capacitive (LC) results from the 3D simulations, and a 2D simulation for each dissection plane and collecting LC results from each of the 2D simulations; d) constructing equivalent circuit models for the group of bond wires and their corresponding die pads based on the results from the 3D and 2D simulations; and e) inputting the equivalent circuit models into a circuit simulator, and modifying the layout to meet noise targets.

BRIEF DESCRIPTION OF THE DRAWINGS

The accompanying drawings, which are incorporated in and which constitute part of the specification, illustrate preferred embodiments of the invention which, together with the general description given above and the detailed description of the preferred embodiments given below, serve to explain the principles of the invention.

DETAILED DESCRIPTION

The present invention provides a fast and relatively accurate bond wire parasitic inductance and capacitance extraction by building an equivalent circuit model of the bond wires.

Die-up (i.e., a chip mounted on top of a package.), Electrically Enhanced Plastic Ball Grid Array (EPBGA) with two rows of bond finger pads and two rows of die pads will be used henceforth only for illustrative purposes. Other suitable types of wire bond chip carriers with in-line or staggered die pads and with one or two rows of bond finger pads can also be used.

In a preferred embodiment of the present invention, the modeling method creates a multi-segment equivalent circuit model consisting of LC values of each segment for a victim-aggressor pair. The modeling method achieves accurate results by factoring important factors affecting the EM field between victim and aggressor wires, including couplings between victim and aggressor wires, couplings from other signal wires, ground shields, power/ground wires, ground planes and die pads.

Figure 4:
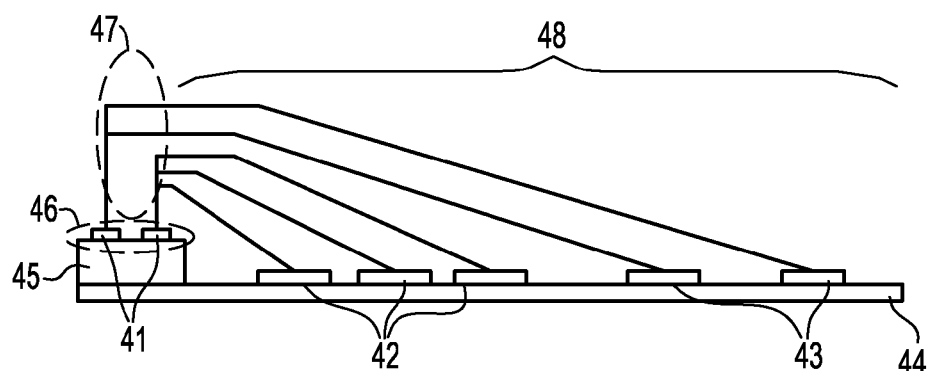
FIG. 4 is a schematic representation of computational regions for a plurality of the bond wires used for simulation, according to the present invention.

Referring to FIG. 4, there is shown a schematic diagram of the partition of the bond wires ready for simulation. The purpose of the simulation is to find self and mutual inductances and capacitances (LC) between the victim and the aggressor in a group of bond wires. According to an embodiment of the invention, a plurality of bond wires is sub-divided preferably into three regions 1, 2, and 3, according to the characteristics of the geometry and the induced EM field, as will be described hereinafter in greater detail.

In one embodiment, Region 1 (46) includes only die pads (41) for all the bond wires forming the group. Region 2 (47) includes the vertical section of the bond wires, while Region 3 (48) includes both the horizontal and diagonal sections of the bond wires.

In another embodiment, Region 1 includes die pads and a small portion of the vertical section of bond wires immediately connected to die pads. Region 2 includes the remaining vertical sections of the bond wires. Electrically, the small portion of the vertical section right on die pads behaves more like die pads instead of bond wires; therefore, it can be thought of as part of die pad model. For simplicity, the small portion is included in Region 2. Power/ground rings (42) may also be included in the model, since they provide a return path for the electric currents flowing through the bond wires. Bond finger pads (43) are not considered electromagnetically relevant in view of their small size and large pitch, and will not be included in the present methodology.

Figure 5A:
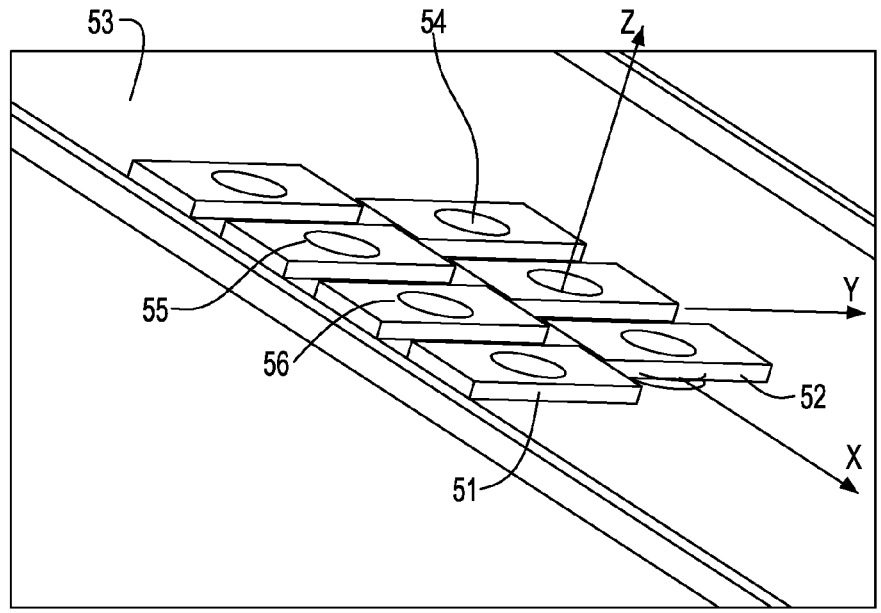
FIGS. 5(a)-5(b) are respectively a 3D view of die pad rows in Region 1 and a corresponding side view of die pad rows in Region 1.
Figure 5B:
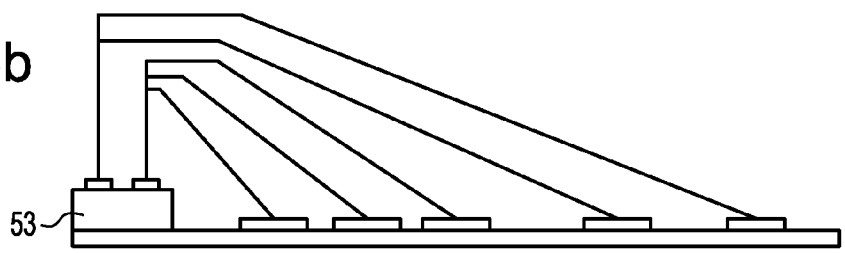

FIG. 5(a) illustrates a 3D perspective view of die pad rows (41) in Region 1 (46) (FIG. 4). The dimension of each die pad and the pitch between die pads in a row and relative position of two die pad rows (51, 52) are specified according to wire bond package design rules. When modeling Region 1, two die pad rows are staggered by half-die pad pitch. The die pad rows are in close proximity of each other, but are not electrically shorted. The circle (54) on the top surface of each die pad refers to a connecting point of the bond wires. Die pads including the small portion of the vertical section of bond wires possibly in Region 1 are typical 3D structures and are suitable for 3D EM simulations. For instance, a fast quasi-static 3D EM solver is utilized to generate lumped self and mutual L and C values between victim die pad (55) and aggressor die pad (56), in which numeral 51 represents an outer die pad row; 52, an inner die pad row; and 53 represents the die (chip), as seen in FIG. 5(b), which is a side view of the die pad rows shown in FIG. 5(a).

Figure 6:
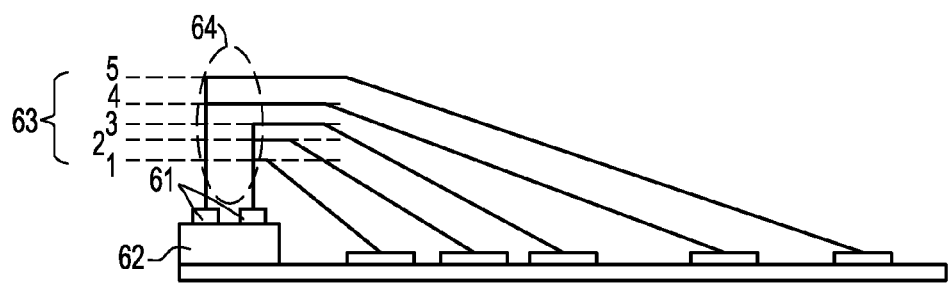
FIG. 6 is a side view of Region 2 and its dissection planes.

FIG. 6 illustrates a side view of Region 2 (64) focusing on modeling the vertical section of the bond wires. Modeling the vertical part of the bond wires is achieved by partitioning the wires into multiple segments by a series of horizontal dissection planes (63). Since wires can have different heights, depending on their ends, the dissection planes can be positioned at different flat tops. Wire segments between two of the nearest planes form a sub-model having a length determined by the spacing separating the two nearest planes. Because of the transmission line like bond wires in each sub-model, a 2D EM simulation tool can be advantageously used to obtain a set of self and mutual inductance and capacitance per unit length between the victim and the aggressor wires. The total LC for a sub-model is computed by multiplying the LC per unit length by the length of the sub-model. Sequentially connecting the total LC of each sub-model generates in the simulation the equivalent circuit model between the victim and the aggressor for the vertical section of the group of the bond wires. The simulated 2D structure of the sub-model is a projection of the sub-model to the upper dissection plane, in which 61 are die pads and 62, is the die.

Figure 7:
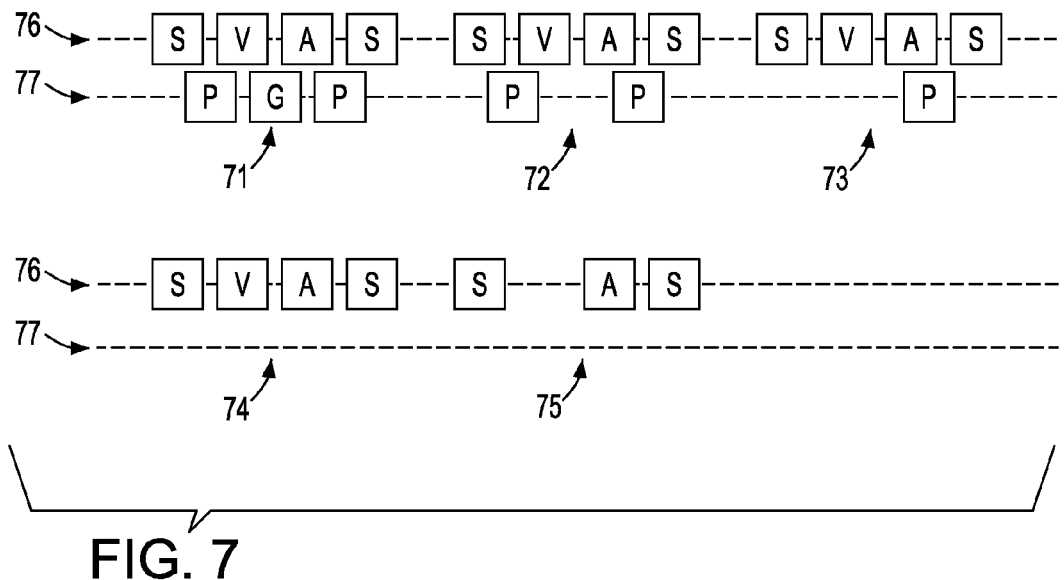
FIG. 7 is a top-down view of exemplary 2D EM sub-models, wherein V is a victim bond wire, A is an aggressor bond wire, S is a neighboring signal wire, P is a power bond wire, and G is a ground bond wire.

FIG. 7 shows an illustrative top view of 2D structures in the five sub-models 63 (1 to 5) shown in FIG. 6. Round cross-sections of the bond wires are replaced by rectangles having the same area for faster simulation. Since each bond wire has a flat top at certain height, a bond wire will be missing from all the sub-models located above it. If the sub-model lacks a power/ground wire segment, a reference ground set located far away thereof will be incorporated into the sub-model for the 2D EM solver in order for it to work properly. If the sub-model has only one victim or aggressor. Only the self-inductance and capacitance per unit length of the victim or the aggressor wire are extracted. Further shown are: sub-model 71 between plane 1 and the top surface of the die pads; sub-model 72 between plane 2 and plane 1; sub-model 73 between plane 3 and plane 2; sub-model 74 between plane 4 and plane 3, and no ground wires. A reference ground set far away is then added. Additionally, for simplicity, only sub-model 75 between plane 5 and plane 4; inner die pad row 76 and outer die pad row 77 are shown.

Figure 8:
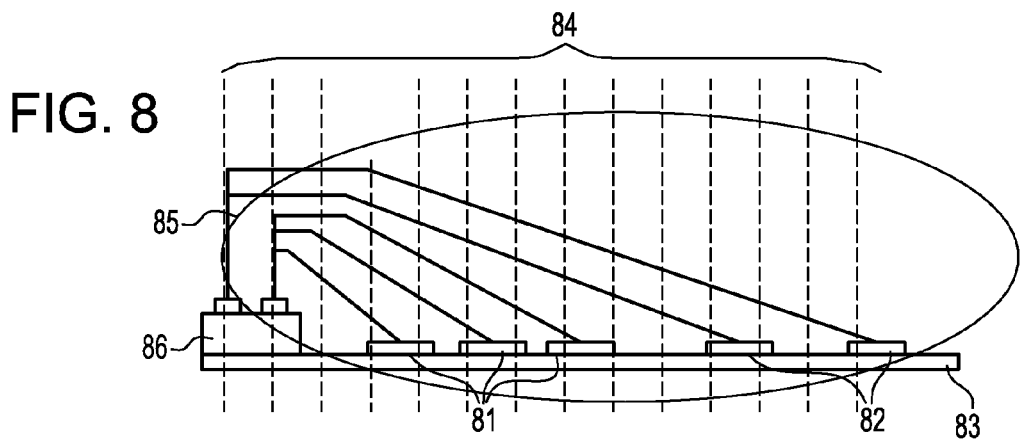
FIG. 8 is a side view of Region 3 and its dissection planes.

FIG. 8 depicts a side view of Region 3 modeling the horizontal and diagonal sections of the bond wires. The modeling method is similar to that for Region 2. Wires are partitioned into a plurality of segments by a series of vertical dissection planes (84). Preferably, the dissection planes are arranged in a dense configuration in order to capture changes of curvature of the bond wires. However, too dense planes will increase the run-time, reducing the feasibility and efficiency of the inventive method. Special dissection planes are inserted in the plane series where bond wires end or change direction. Likewise, wire segments between two neighboring planes form a transmission line, like the sub-model simulated by the 2D EM solver, producing a set of self and mutual L and C per unit length between the victim and the aggressor wires. The length of a segment is assumed to be the spacing between the two nearest planes. The total LC for a sub-model is determined by multiplying LC per unit length by the length of the sub-model. Sequentially connecting the total LC of each sub-model generates an equivalent circuit model for the horizontal and the diagonal sections of a group of the bond wires in the simulation. The simulated 2D structure of the sub-model is determined by projecting the sub-model to the left dissection plane, in which the power and ground rings are labeled 81; the bond finger pads, 82; the package, 83; the view point from the die side, 85; and the die, 86.

Figure 9A:
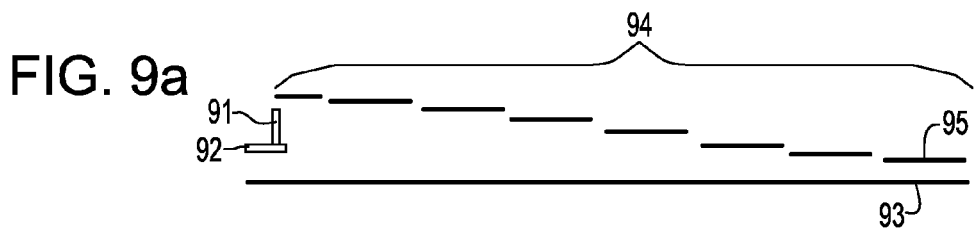
FIGS. 9(a)-9(b) are respectively a schematic diagram of multiple sub-models in Region 3, and projections of sub-models on dissection planes seen from the die side.

Although the wire segments between two neighboring planes may be diagonally oriented, such as those in the diagonal portion of the bond wires in the JEDEC specification, it is assumed that the transmission line in the sub-models have the same cross-section as the projections of the sub-models shown with reference to FIG. 9(a). The vertical section 91 includes the top surface of the die pads, 92; the package, 93; the sub-models in Region 3, 94; and the front view, 95.

Figure 9B:
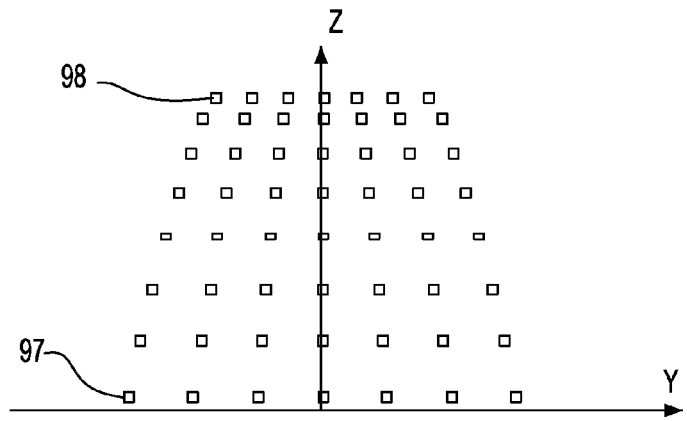

Referring to FIG. 9(b), a projection of multiple sub-models is seen from the aforementioned die side (85). Images of the bond wires gradually fan-out from the flat top (98) to the bond finger pads (97) because, usually, the pitch of bond finger pads is much larger than that of the die pads.

Figure 10:
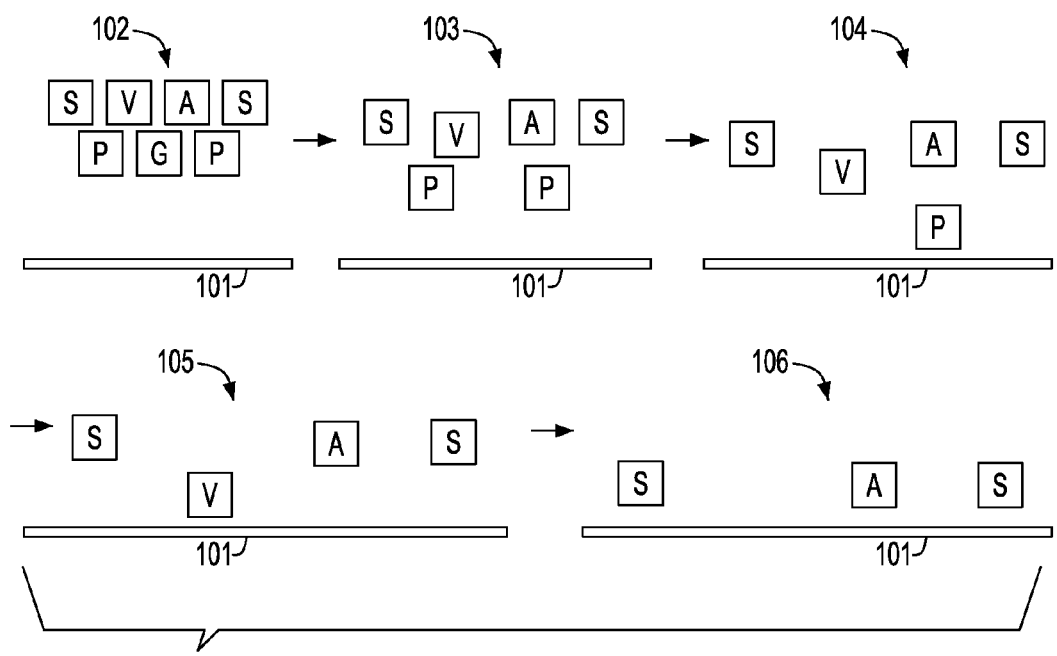
FIG. 10 illustrates 2D structures of sub-models along bond wires descending from die pads to bond finger pads, where V, A, S, P, and G are bond wires previously defined in FIG. 7.

FIG. 10 illustrates 2D structures of sub-models in Region 3. The round cross-sections of the bond wires are replaced by rectangles with the same area for faster simulation. The difference from their counterparts in Region 2 is that the sub-models in Region 3 have not only ground wires, but also ground planes (101) embedded in the package. For sub-models far away from the surface of the package (same location as 101), the ground plane does not significantly affect the EM field and the main current return path still remains to be the ground bond wires. However, the available ground plane is essential for the models, in case where there are no ground wires in the 2D sub-model—because the ground wires have already terminated on rings (81, FIG. 8), e.g., in 2D sub-models near the bond finger pads. With the descending bond wires from the flat tops to the bond finger pads (82), the bond wires in 2D sub-models are farther apart and nearer to ground planes in the package. The shorter the bond wire, the faster the drop, ending at the package. If the sub-model has only one victim or aggressor, only the self-inductance and C per unit length of the victim or aggressor wire is extracted. Numeral (102) is the sub-model at or near the flat tops in which all the wires are in close proximity of each other, with the power (P)/ground wires (G in dash lines) serving as a return path. This is the case before the ground wire ends on a ring; (103) is the sub-model after some descent of each wire, and the ground wire ending on the ring; (104) is the sub-model after additional descent, and the ground and one power wire ending on rings; (105) and (106) are the sub-models after all the power/ground wires end on rings; (105) is the sub-model immediately before the victim wire ends on the inner bond finger pad; and (106) is the sub-model right before the aggressor wire ends on the outer bond finger pad. Furthermore, V is the victim wire; A is the aggressor wire; and S is the electrically floating neighboring signal wires of V and A.

Described above is a fast and accurate modeling for a group of the bond wires corresponding to one entry in the LC table.

A set of 10 of the geometry parameters most influential to the EM field are preferably used to characterize the group of the bond wires, in which a set of values of 10 parameters defines a specific geometry for the group of bond wires corresponding to one entry in the table.

Figure 11:
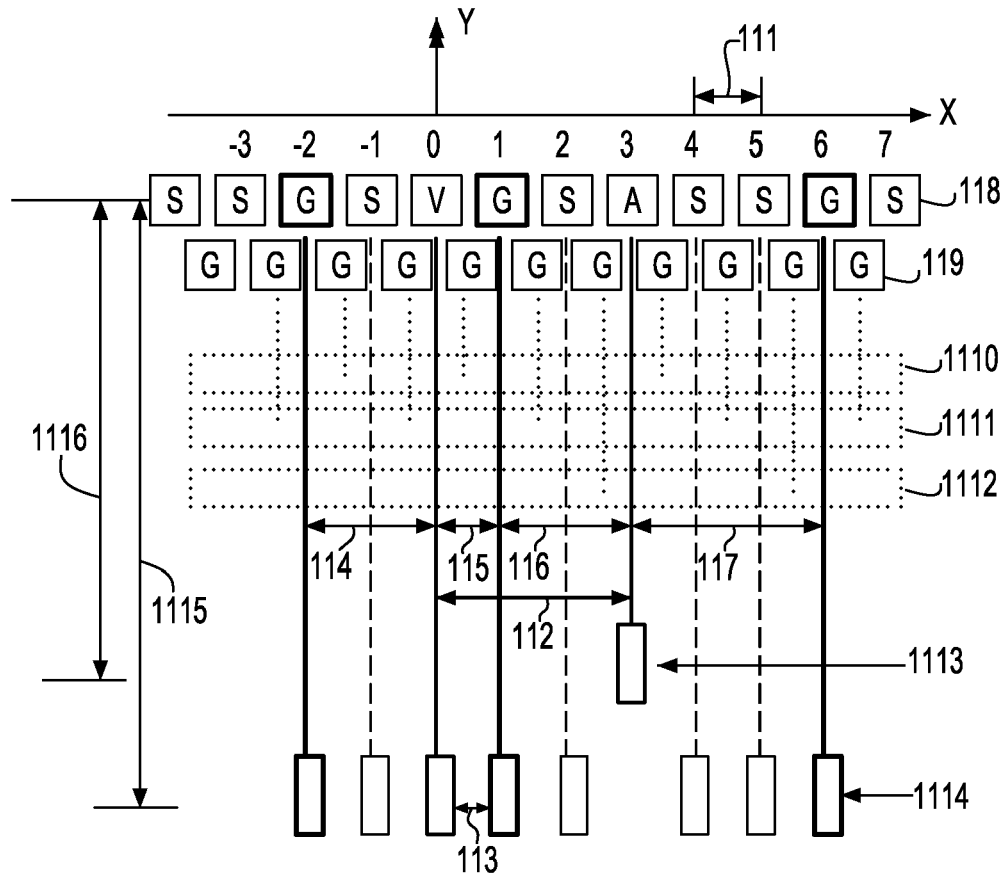
FIG. 11 shows a schematic top view of the bond wires and parameters in LC loop up table, where V, A, S, P, and G are bond wires previously defined in FIG. 7.

Referring to FIG. 11, there is shown a schematic diagram of a top view of bond wires and parameters controlling the relative positions between a victim wire (V), an aggressor wire (A) and their surrounding power/ground wires (G in dash lines), and signal wires (S). For simplicity, all the bond wires are drawn in parallel, although this may not be necessarily true in real simulations. The coordinate x points in the direction of the die pad rows, with y in a perpendicular direction to x. The absolute x coordinate of the die pad of the victim bond wire is set at V at the origin. The die pad pitch (111) remains the same for both die pad rows. (118) is the inner die pad row, and (119) is the outer die pad row). The two die pad rows are staggered by half-pitch. The grid number can be used to fully specify the position of the die pads of all the bond wires. For example, still referring to FIG. 11, the x coordinate of the aggressor bond wire A is 3, and the x coordinates of ground wires on the outer die pads are ±0.5, ±1.5, ±2.5, etc. Half-integers of x refer to a different die pad row from the one where the victim wire is located. Therefore, if a die pad row for the victim wire is given, the die pad rows and x coordinates for all the other bond wires in the model are fixed by a set of integer and half integer grid numbers.

In order to determine the base point of the model geometry, the die pad and bond finger pad rows of the victim wire EndV are preferably chosen as one of the parameters. There are four possible values of EndV in a bond wire technology having two die pad rows and two bond finger pad rows. To reduce the simulation time without sacrificing accuracy, the group of bond wires in the simulation is preferably kept compact, resulting in a reduced number of table entries. The size of the model for each entry is, likewise, also smaller. Only wires having a primary effect on the EM field around the victim and aggressor wires are characterized. The most obvious factor is the distance x between victim and aggressor wires: $D_{va}$ (112) is calculated by $A_x-V_x$, where $A_x$ is the absolute x coordinate of the die pad of the aggressor A. Most of the power/ground wires are connected to rings, and are located much lower than the signal wires. Therefore, they are not deemed very important for determining the EM field. However, some ground wires act as shields, ending at the bond finger pads and near to the victim and aggressor wires. The ground wires are characterized by parameters $D_{vs1}$ (114), $D_{vs2}$ (115), $D_{as1}$ (116) and $D_{as2}$ (117) in FIG. 11, respectively present the x distance between the victim and the left nearest shield (seen from the bond finger pads side), the x distance between the victim and the right nearest shield (seen from the bond finger pads side), the x distance between the aggressor and the left nearest shield (seen from the bond finger pads side) and the x distance between the aggressor and the right nearest shield (seen from the bond finger pads side). The die pad pitch $D_d$ (111) is fixed according to design rules in term of the absolute x distance for the 2D solver; therefore, it is not included as one of the parameters. The bond finger pitch characterized by $D_b$ (112) can take multiple values. The length of victim is referenced as d in FIG. 4. LenV (1115) and the length of the aggressor LenA (1116) are two of the other parameters to be considered. The victim and aggressor wires end at different bond finger pad rows (1113). The inner bond finger pad row and (1114) and the outer bond finger pad row define LenV–LenA as the spacing between two rows, added to the spacing between two die pad rows, when the victim (V) and aggressor (A) start from different die pad rows. According to the design rules, ground shields, particularly for the victim wire end at the same row of bond finger pad as the victim wire. The ground shields, especially for the aggressor wire end on the same row of the bond finger pad, as the aggressor wire. If the victim and aggressor share the same shield, i.e., the summary of the absolute value of $D_{vs2}$ and the absolute value of $D_{as1}$ equal the absolute value of $D_{va}$, it is worth assuming that the common shield ends at the same row of bond finger pad as the victim wire. The thickness of the die DieT is the only parameter worth considering in a direction perpendicular to the x,y plane. The above parameters fully specify the die pad row and the bond finger pad row each bond wire in the group ends, which determines for each wire the loop number (loops 1 and 2, in FIG. 4), and the loop height according to the design rules. Except for the above parameters, ground wires (G in dash lines) connecting to rings and electrically floating signal wires (S) are also added into the models at the nearest die pads and bond finger pads to the victim and aggressor, if the spaces have not been occupied by shields (G in solid lines). In this manner, the capacitance coupling is significantly shielded from neighboring wires. Accordingly, the value of mutual capacitance C between the victim and the aggressor will be lower if there is a wire between them. Another reason is that power/ground wires connecting to rings serve as a current return path to reduce the self and mutual inductance in the absence of dedicated ground shields. These factors are not as strong as those included in the above 10 parameters, therefore they are usually relegated to secondary effects. Three power/ground rings (1110, 1111, 1112) are shown in FIG. 11, but the method is applicable to the case of missing rings.

Figure 12:
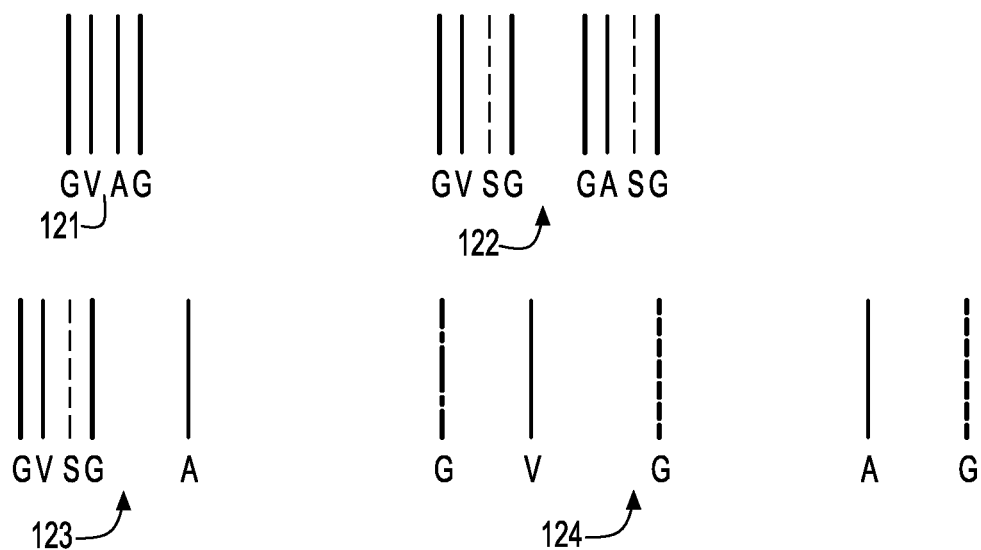
FIG. 12 illustrates four categories of bond wire geometries in the LC table, where V, A, S, P, and G are bond wires previously defined in FIG. 7.

Particular care is taken when building LC tables for the bond wires. To avoid an uncontrolled range of data points for each parameter and an uncontrolled combination of data points among parameters, all entries in the table are preferably classified into four categories, as shown in FIG. 12, by considering a realistic bond wire routing in a design. In high speed wire bond design applications, fast signals are implemented as differential pairs shielded by dedicated ground wires on each side. Inside pair coupling (121) refers to the case that both the victim and the aggressor belong to the same differential pair, while the pair-pair coupling (122) represents the victim and the aggressor in different pairs. The third category is a pair-single net coupling (123) where either the victim or the aggressor is in a differential pair, while the other is in a single net. Bond wires for single nets have no shields, unless they happen to be near the differential pair. Usually, in the category of a single net—single net coupling (124)—neighboring ground shields may not exist altogether. The ground wires for this category are shown in FIG. 12 as dashed lines. The four categories include almost all the typical and important physical relations among bond wires. Furthermore, the data points possibly taken by parameters are greatly limited. For example, for an inside pair coupling, $D_{va}$ can only take the value 0.5 or 1, depending on the number of die pad rows in design, and $D_{vs1}$ can only be −0.5 or −1, and the like.

Figure 13:
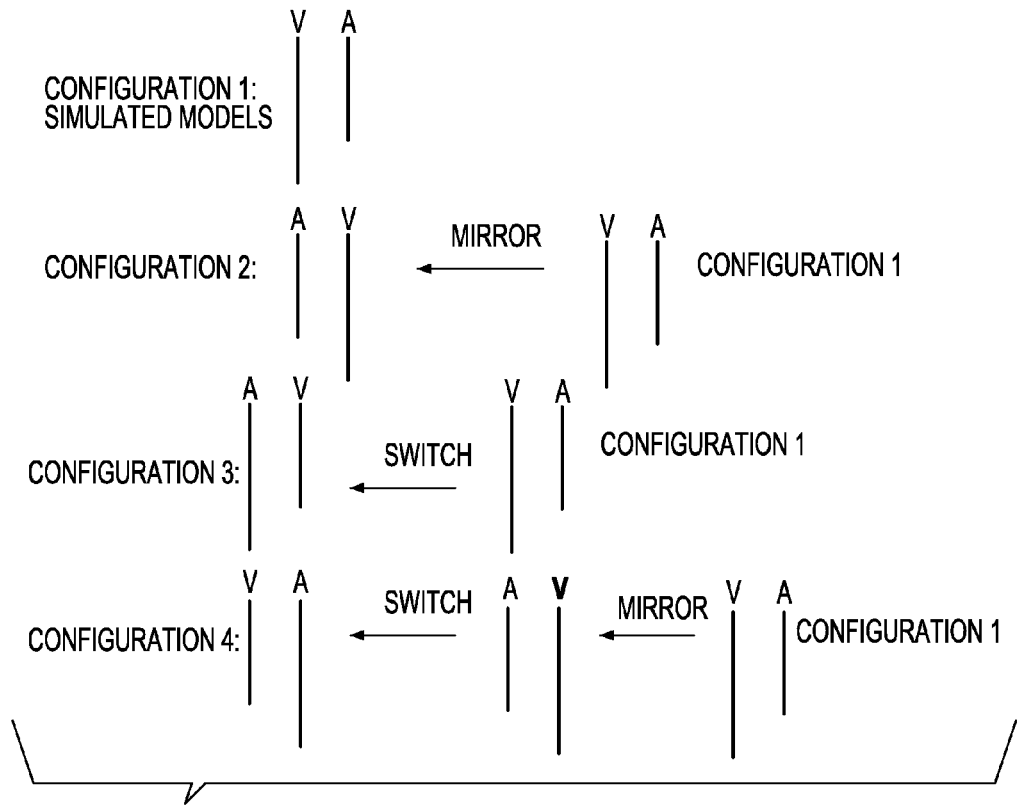
FIG. 13 depicts four physical configurations and switch and mirror functions for V, a victim bond wire and A, an aggressor bond wire.

In order to further reduce the number of simulations, it is required that LenV in each bond wire structure in the simulation be greater than or equal to LenA minus the pitch between inner die pad row and outer die pad row. It is also required that $D_{va}$ in every bond wire structure in the simulation be positive. Thus, only one configuration to be modeled remains. LC values for all the other configurations can be obtained by applying mirror and/or switch functions on the existing data, as shown in FIG. 13. Configuration 1 satisfies both requirements and is simulated by the above modeling method. The physical structure of configuration 2 does not satisfy the requirement regarding $D_{va}$, although this configuration is just a mirror of configuration 1, with the associated EM field as a mirror. Therefore, no new simulation is needed. The self and mutual LC per unit length for the victim and the aggressor wires in configuration 1 is the same as the corresponding in configuration 2. Configuration 3 does not meet any of the requirements. However, the physical structure and the EM field of configuration 3 are exactly the same as those corresponding to configuration 1. LC values associated with the victim (aggressor) in configuration 1 are the same as those applicable to the aggressor (victim) in configuration 3. Configuration 4 breaks the rule regarding the length. The LC values for configuration 4 are obtained by sequentially applying a mirror and switch operations to those corresponding to configuration 1.

An LC table is automatically generated for each chip/bond wire package technology. Generally, one may reduce the runtime of the LC table generation by 75% by simulating only one victim-aggressor configuration followed by applying mirror and switch functions.

Figure 14:
FIG. 14 shows a schematic diagram of equivalent circuits for the victim and its aggressor.
Figure 14:
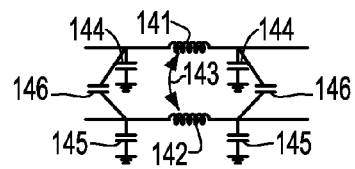
Figure 14:
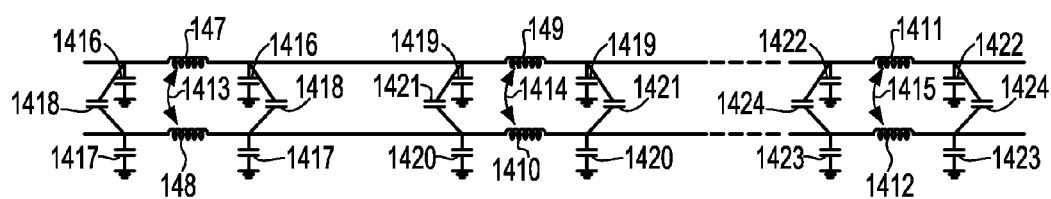

FIG. 14 shows a schematic diagram of the equivalent circuits for the victim and its aggressor, corresponding to one entry in the table, with subscripts i (i=1 or 2) referring to either the victim or the aggressor. The LC for die pads can be directly extracted from the table, although one for each sub-model in the vertical and horizontal section is advantageously computed by multiplying the LC per unit length from the table by the corresponding length of the sub-model. The capacitance can be evenly distributed at both ends or confined on one end of each sub-model. 141 is the self-inductance of victim die pad; 142 is the self-inductance of aggressor die pad; and 143 is the mutual L between victim and aggressor die pads. Numerals 144 and 145 are respectively one-half the self capacitance of the victim die pad, and one-half the self-capacitance of the aggressor die pad. Moreover, 146 is half the mutual capacitance between the victim and aggressor die pads, and in the equivalent circuit, for the vertical section, 147 is the self-inductance of the first sub-model of victim bond wire; 148 is the self-inductance of the first sub-model of aggressor bond wire; 149 is the self-inductance of the second sub-model of victim bond wire. 1410 is the self-inductance of the second sub-model of aggressor bond wire; 1411 is the self-inductance of the last sub-model of victim bond wire; 1412 is the self-inductance of the last sub-model of aggressor bond wire; 1413 is the mutual inductance between the first sub-model of victim and aggressor bond wires; 1414 is the mutual inductance between the second sub-model of victim and aggressor bond wires; 1415 is the mutual inductance between the last sub-model of victim and aggressor bond wires; 1416 is one-half of the self capacitance of the first sub-model of victim bond wire; 1417 is half the self-capacitance of the first sub-model of the aggressor bond wire. 1418 is half of the mutual capacitance between the first sub-model of victim and aggressor bond wires. 1419 is half the self-capacitance of the second sub-model of victim bond wire; 1420 is half the self-capacitance of the second sub-model of aggressor bond wire; 1421 is half the mutual capacitance between the second sub-model of victim and aggressor bond wires; 1422 is half of the self capacitance of the last sub-model of victim bond wire; 1423 is half the self-capacitance of the last sub-model of aggressor bond wire; and 1424 is half the mutual capacitance between the last sub-model of victim and aggressor bond wires.

The total self and mutual LC for the entire victim or the entire aggressor bond wire in an entry can be obtained by summarizing the distributed LCs. It is found that the total LC is linear with LenV. Therefore, the number of entries can be further reduced by removing LenV and LenA as independent parameters. A new parameter LenV−LenA, i.e., the spacing between the row of bond finger pads the victim and the aggressor wires end is employed. In this way, the entries have the same LenV−LenA and only differ in that LenV will merge into one entry. Through interpolation over LenV, the distributed LC is replaced by the effective lumped self and mutual LC as well as the effective self and mutual LC per unit length. The number of parameters can be further reduced to 7 at the cost of some loss of accuracy.

Figure 15:
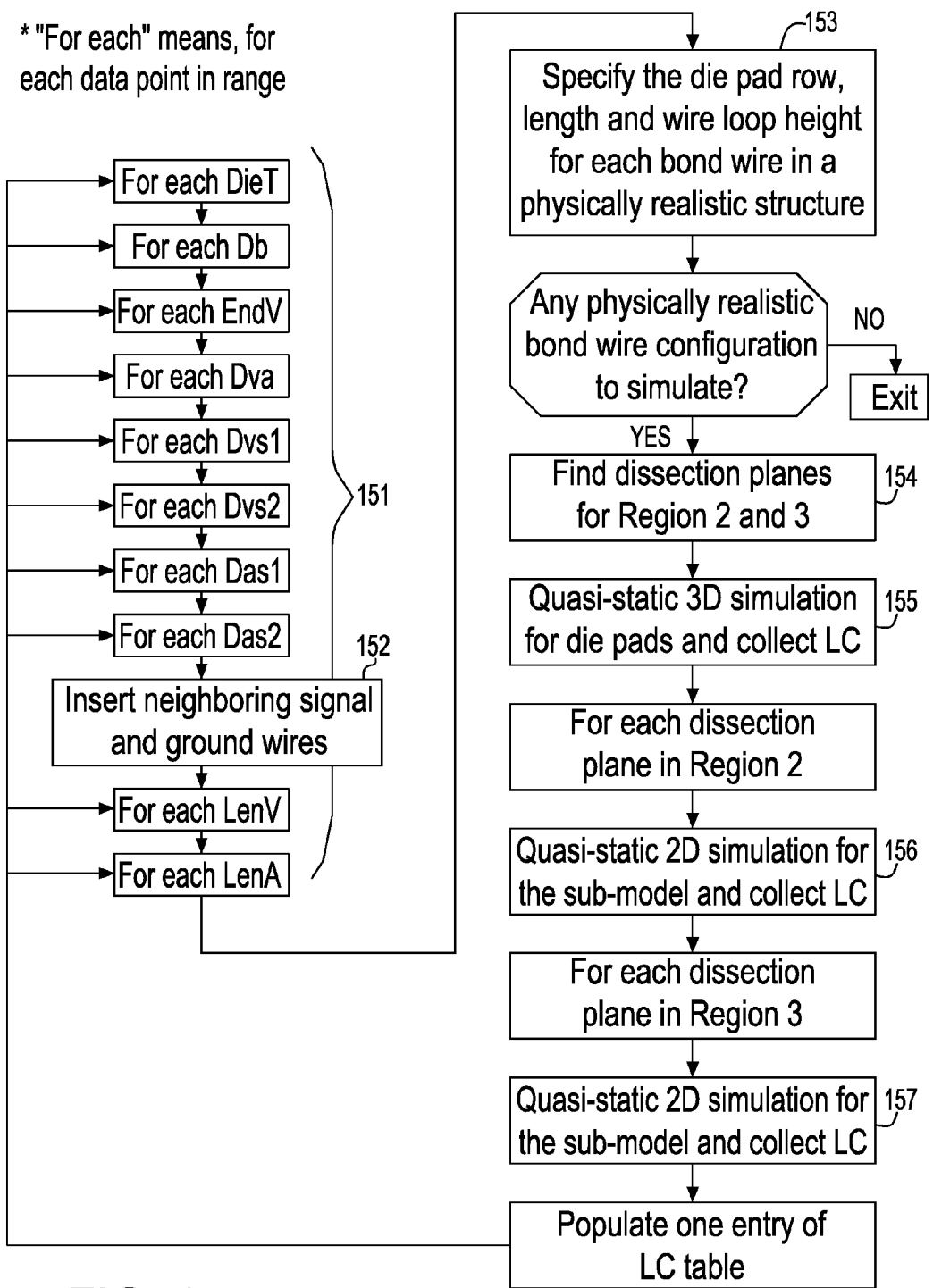
FIG. 15 is a flow chart describing the algorithm, in accordance with the present invention.

FIG. 15 is a flow chart of the algorithm implemented in software. For clarity, dash arrows associated with numerals are used. The flow chart is suitable for any of the four simulation categories listed in FIG. 12.

Initially, the tool automatically filters physically realistic and electrically significant wire bond geometries, followed by partitioning the wire bonds into three sections and completing the simulation for each section. Hereinafter, is a detailed description of the blocks forming the flow chart shown in FIG. 15.

Block 151 itemizes data points for the previously selected 10 input parameters. The data points and ranges strongly depend on the simulation category, as explained with reference to FIG. 12. Additionally, the data range can be further limited by determining the strength of the EM field between two bond wires. For example, if the EM coupling between two bond wires further 10 grid numbers apart in the x direction (FIG. 11) is too small compared to the required modeling accuracy, the data ranges of $D_{va}$ (112), $D_{vs1}$ (114), $D_{vs2}$ (115), $D_{as1}$ (116) and $D_{as2}$ (117) can be limited to 10 or −10. The ranges of LenV and LenA can be bounded by the maximum bond wire length within the design rules, while the lower bound of these ranges can be determined by the number of power/ground rings (1110), (1111), (1112) and the minimum spacing among die (86) and rings. Furthermore, the choice of data points of $D_b$ (113) strongly rely on design rules which usually only provides a limited number of feasible bond finger pitches.

Incorporated in each block 151 is a step of filtering physically realistic bond wires. For example, in the block 'for each $D_{vs2}$', if $D_{va}=D_{vs2}$, the aggressor and the shield for the victim overlap. If it is determined that it is not a physically realistic configuration, then the flow skips to the next $D_{vs2}$ data point. The value of $D_{vs2}$ is determined once the data point of $D_{vs2}$ together with the values of all the other parameters already in the flow, i.e., DieT, $D_b$, EndV, $D_{va}$ and $D_{vs1}$, meet the required physically realistic bond wires. Other typical filtering criteria in 151 include, but are not limited to:

If $D_{va}=-D_{as1}$, skip to the next data point of $D_{as1}$.

If neither of following three situations is satisfied, skip to the next data point of $D_{as1}$:
  i) there is no shield on the left side of victim and aggressor (seen from the bond finger pads side) and $D_{vs2}>D_{va}$;
  ii) $D_{va}+D_{as1}=D_{vs1}$ and $D_{vs2}>D_{va}$; and
  iii) $D_{va}+D_{as1}>D_{vs2}$.

If LenV<LenA minus the distance between two die pad rows, it violates the length requirements defined in FIG. 13, and the algorithm branches to the next LenA data point.

If LenV−LenA is greater than the distance between two die pad rows in the 'inside pair' simulation configuration, it violates the definition of differential pairs, and is followed by branching to the next data point of LenA.

It is allowed that the victim and the aggressor share the same shield. In this case the total number of the bond wires in the group is reduced.

In block 152, an insertion of neighboring signal and ground wires is performed. Following the specification of EndV, $D_{va}$ (112), $D_{vs1}$ (114), $D_{vs2}$ (115), $D_{as1}$ (116) and $D_{as2}$ (117), the nearest empty spots to the victim and the aggressor in both die pad rows and both bond finger pad rows are filled with ground wires (G in FIG. 11), connections to the rings and electrically floating signal wires (S in FIG. 11). According to the design rules, ground wires connecting to the rings can only be placed on the outer die pad row (119), while the ground shields (G in FIG. 11) and signal wires (V, A and S in FIG. 11) may start from any die pad row. The design rules set the criteria for the insertion step. The rings for the filler ground wires are randomly chosen since they are not electromagnetically relevant. The electrically floating signal wires end on the same die pad row and bond finger pad row, if permitted.

Figure 1:
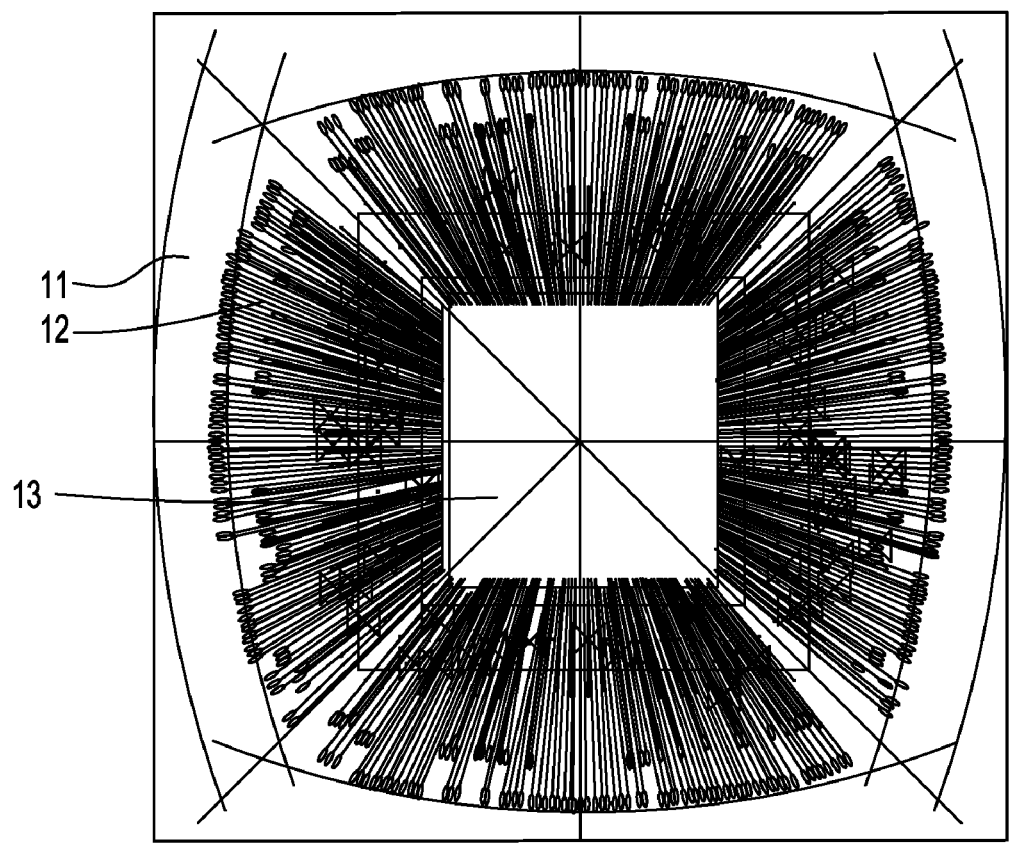
FIG. 1 is a top view of a prior art wire bond design.
Figure 2A:
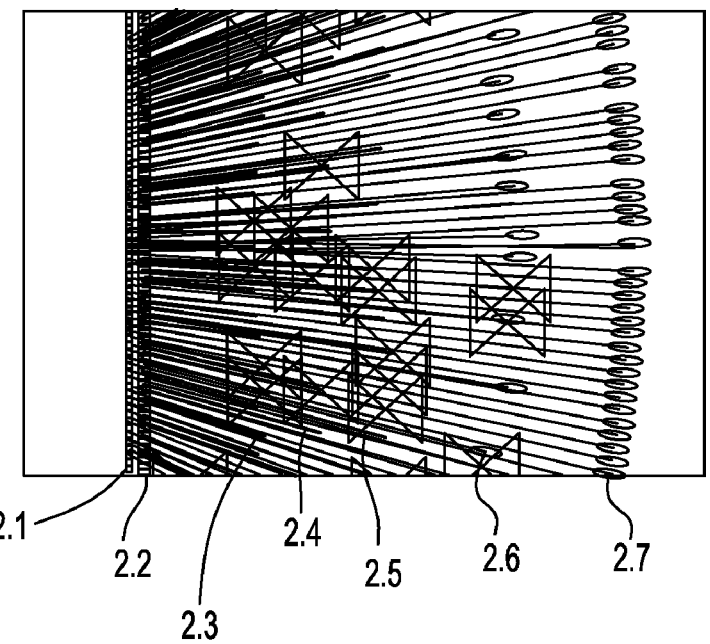
FIG. 2(a) shows a zoom-in picture of a portion of the wire bond design shown in FIG. 1.
Figure 2B:
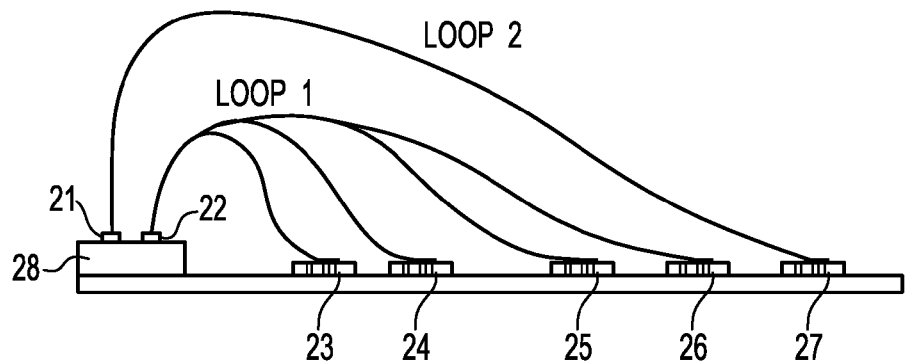
FIG. 2(b) is a schematic diagram of a side view of the prior art bond wires and bond pads.
Figure 3:
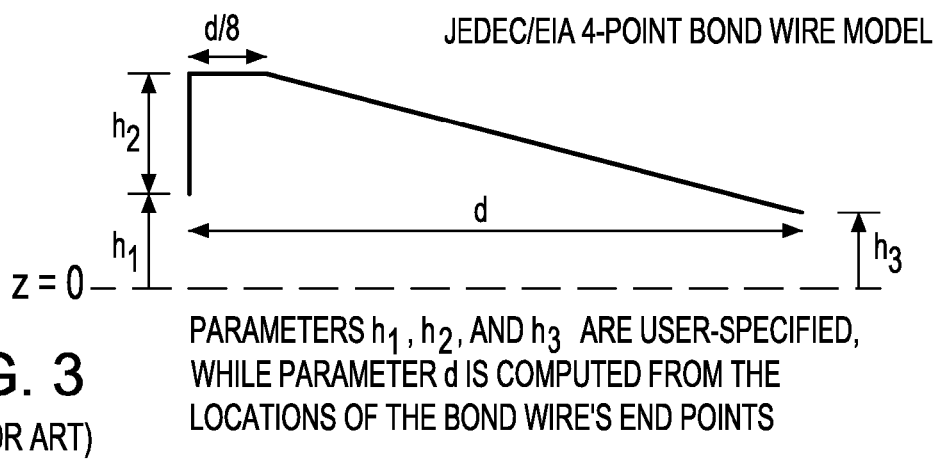
FIG. 3 is a conventional representation of a JEDEC four-point bond wire.

Block 153 describes a full specification of the geometry of each bond wire in the group, including the die pad row, bond finger pad row, length, and wire loop height. As described with reference to FIG. 11, EndV is the base parameter for the entire simulation wire group. According to the die pad row of victim in EndV and the integer or half integer property of $D_{va}$, $D_{vs1}$, $D_{vs2}$, $D_{as1}$ and $D_{as2}$, the die pad rows of aggressor, shields, neighboring signal wires and ground wires are determined. The bond finger pad row of victim of EndV and the value of LenV–LenA help fix the bond finger pad row of the aggressor, as well as the pitch between two bond finger pad rows if the value of LenV–LenA is larger than the pitch of two die pad rows. The bond finger pad rows and wire length of shields and neighboring signal wires are determined accordingly. The loop height is fixed (FIG. 2(b)) once the die pad row and bond finger pad row of a wire are specified. It is worth pointing out that some of the simulations can be avoided by the application of mirror functions.

In block 154, dissection planes for Region 2 and 3 are determined. In Region 2, the dissection planes are at the flat tops of the bond wires. In Region 3, the length of each sub-model is initially defined. Then, dissection planes can be inserted at the end of sub-models. In order to capture changes in the wire curvature, wire number, and the existence of ground plane in the simulation, additional dissection planes should be added. For example, a dissection plane is preferably inserted at each die pad row at the points where horizontal portion of wires end, at the edge of die and at two edges of each power/ground ring at the landing location of each wire on rings or bond finger pads.

Block 155 shows a quasi-static 3D simulation for the die pads and collects the LCs. An input file for the quasi-static 3D simulation needs to be provided for the die pads. Included in the file are geometries of die pads and power/ground planes, as well as the simulation setup parameters. Upon completion of the 3D simulation, the flow loads the LC results, and the data is then preferably written in an LC look-up table.

Blocks 156 and 157 show quasi-static 2D simulations for the sub-model and collects the LCs for each sub-model in Regions 2 and 3. An input file is prepared for the 2D simulation for each sub-model including 2D geometry of the bond wires and power/ground planes, if any, as well as the simulation setup parameters. After performing the 2D simulation, the flow loads the LC results and writes the data in the LC look-up table. Finally, simulation results are advantageously summarized and stored in the look-up table.

The experimental results show that the simulation of a group of seven bond wires, having a victim and an aggressor, may take 10-15 mins and reach 85% accuracy, compared with obtained by a corresponding full wave 3D EM simulation which takes 3-4 hrs.

The present invention can be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out the methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of modeling bond wires and corresponding pads in an integrated circuit (IC) package design for predicting noise effects of the bond wires and the corresponding pads in IC signal transmission paths, the method comprising:
    a) using a computer, setting parameters related to an IC package layout geometry of a group of bond wires and their corresponding pads;
    b) sub-dividing said group of bond wires and their corresponding pads into regions, each region including a portion of each bond wire or its corresponding pad, and generating dissection planes for said regions comprising said bond wires according to wire loop type, curvature of wires, landing locations of wires and existence of power and ground planes, dissecting a vertical region by horizontal dissection planes at flat tops of said bond wires, and dissecting a horizontal dissection region by unevenly spaced vertical planes;
    c) performing with a computer 3D simulations on said regions comprising said corresponding pads, and a 2D simulation for each dissection plane;
    d) constructing equivalent circuit models for said group of bond wires and their corresponding pads based on results from said 3D and 2D simulations; and
    e) inputting said equivalent circuit models into a circuit simulator, and modifying said layout to meet noise targets.

2. The method as recited in claim 1, wherein said noise effects are caused by electromagnetic coupling (EM) between said bond wires, and wherein said bond wires are impacted by said EM between victim wires and aggressor wires, said EM extending to signal wires, ground shields, power and ground wires, ground planes, and die pads.

3. The method as recited in step b) of claim 1 further comprising said dissecting said horizontal region by said unevenly spaced vertical dissection planes with denser planes at a portion of said wires that change curvature and coarser planes at a remaining portion of said bond wires.

4. The method of claim 1, wherein said IC package layout geometry is three dimensional.

5. The method of claim 1 further comprising collecting inductive and capacitive (LC) results from said 3D simulations, and collecting LC results from each of said 2D simulations.

6. The method as recited in claim 5 further comprising creating a file for storing the results from said 2D and 3D simulations.

7. The method as recited in claim 5 further comprising converting said file into an LC look-up table.

8. The method as recited in claim 7 further comprising constructing said equivalent circuit models using said LC look-up table.

9. The method as recited in claim 7 further comprising simplifying said LC look-up table by classifying victim-aggressor couplings into predetermined electrically relevant categories, reducing uncontrolled combinations of parameter data points.

10. The method as recited in claim 7 further comprising reducing runtime for generating said LC look-up table by simulating one victim and aggressor bond wire configuration followed by applying mirror and switch techniques to reduce other configurations of said bond wires to be simulated.

11. The method as recited in claim 1, wherein said 3D simulation is quasi static.

12. The method as recited in claim 1 further comprising incorporating factors in EM coupling of bond wire configurations.

13. The method as recited in claim 1 further comprising modeling said 2D simulations multi-segment bond wires and extracting electrical parasitics.

14. The method as recited in claim 13 further comprising electrical parameters associated with said group of bond wires prior to simulation.

15. The method as recited in claim 1, further comprising converting a first 3D simulation into a second 3D simulation associated with said die pads and multiple 2D simulations associated with said bond wires.

16. The method as recited in claim 15 further comprising factoring high frequency effects by modeling current return paths through power and ground die pads, bond wires, rings, and solid planes.

17. The method as recited in claim 1 further comprising generating an LC look-up table for each chip bond wire package technology.

18. The method as recited in claim 1 further comprising incorporating the speed of said 2D simulation and the accuracy of said 3D simulation in accordance to said bond wires nature.

19. The method as recited in claim 18 wherein said speed of said 2D simulation and 3D simulation accuracy is achieved by breaking said bond wires into separate regions dissected into segments, and generating LC values for each individual segment using said 2D simulation.

20. The method as recited in claim 19 wherein said 2D simulation, includes return paths for electric currents flowing through said bond wires.

21. The method as recited in claim 19 further comprising creating multi-segment equivalent circuit models consisting of LC values of each segment for pairs of victim and aggressor bond wires.

22. A non-transitory storage device readable by a machine, tangibly embodying a program of instructions executable by the machine to perform method steps of modeling bond wires corresponding pads in an integrated circuit (IC) package design for predicting noise effects of the bond wires and the corresponding pads in IC signal transmission paths, the method comprising:
   a) using a computer, setting parameters related to an IC package layout geometry of a group of bond wires and their corresponding pads;
   b) sub-dividing said group of bond wires and their corresponding pads into regions, each region including a portion of each bond wire or its corresponding pad, and generating dissection planes for said regions comprising said bond wires according to wire loop type, curvature of wires, and existence of power and ground planes, dissecting a vertical region by horizontal dissection planes at flat tops of said bond wires, and dissecting a horizontal dissection region by unevenly spaced vertical planes;
   c) performing with a computer 3D simulations on said regions comprising said corresponding pads, and a 2D simulation for each dissection plane;
   d) constructing equivalent circuit models for said group of bond wires and their corresponding pads based on results from said 3D and 2D simulations; and
   e) inputting said equivalent circuit models into a circuit simulator, and modifying said layout to meet noise targets.

* * * * *